US011183570B2

United States Patent
Singh et al.

(10) Patent No.: US 11,183,570 B2
(45) Date of Patent: Nov. 23, 2021

(54) STRUCTURES AND METHODS FOR NOISE ISOLATION IN SEMICONDUCTOR DEVICES

(71) Applicant: Taiwan Semiconductor Manufacturing Co., Ltd., Hsinchu (TW)

(72) Inventors: Gulbagh Singh, Hsinchu (TW); Tsung-Han Tsai, Zhunan Township (TW); Kun-Tsang Chuang, Miaoli (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/729,704

(22) Filed: Dec. 30, 2019

(65) Prior Publication Data

US 2020/0135875 A1 Apr. 30, 2020
US 2021/0328031 A9 Oct. 21, 2021

Related U.S. Application Data

(63) Continuation of application No. 16/035,128, filed on Jul. 13, 2018, now Pat. No. 10,546,937.

(Continued)

(51) Int. Cl.
*H01L 29/76* (2006.01)
*H01L 29/417* (2006.01)
(Continued)

(52) U.S. Cl.
CPC .......... *H01L 29/41791* (2013.01); *H01L 21/823821* (2013.01); *H01L 27/0924* (2013.01);
(Continued)

(58) Field of Classification Search
CPC ......... H01L 21/823821; H01L 27/0924; H01L 29/0649; H01L 29/66795; H01L 29/785; H01L 29/7853; H01L 29/41791
(Continued)

(56) References Cited

U.S. PATENT DOCUMENTS 7,038,289 B2 * 5/2006 Marty ............... H01L 21/76232
257/501
7,042,095 B2 5/2006 Noguchi et al.
(Continued)

FOREIGN PATENT DOCUMENTS

| CN | 102468216 A | 5/2012 |
| CN | 102694007 A | 9/2012 |
| JP | 2007227761 A | 9/2007 |
| KR | 20030078750 A | 10/2003 |
| KR | 20050018187 A | 2/2005 |
| KR | 20140119954 A | 10/2014 |

OTHER PUBLICATIONS

Korean Application No. 10-2020-013544, Office Action dated Jul. 16, 2021; English Translation from EPO Global Dossier, 9 pages.

*Primary Examiner* — Luan C Thai
(74) *Attorney, Agent, or Firm* — Sterne, Kessler, Goldstein & Fox P.L.L.C.

(57) ABSTRACT

The present disclosure relates to a semiconductor structure includes a substrate with a top surface and first and second devices formed on the top surface of the substrate. The semiconductor structure also includes a deep isolation structure formed in the substrate and between the first and second devices. The deep isolation structure includes a top portion formed at the top surface and having a top width and a bottom surface having a bottom width larger than the top width.

20 Claims, 5 Drawing Sheets

Related U.S. Application Data (60) Provisional application No. 62/589,516, filed on Nov. 21, 2017.

(51) Int. Cl.
*H01L 29/06* (2006.01)
*H01L 29/78* (2006.01)
*H01L 29/66* (2006.01)
*H01L 21/8238* (2006.01)
*H01L 27/092* (2006.01)

(52) U.S. Cl.
CPC .... *H01L 29/0649* (2013.01); *H01L 29/66795* (2013.01); *H01L 29/785* (2013.01); *H01L 29/7853* (2013.01)

(58) Field of Classification Search
USPC .......................................................... 257/365
See application file for complete search history.

(56) References Cited

U.S. PATENT DOCUMENTS

| | | |
|---|---|---|
| 7,157,770 B2 | 1/2007 | Park et al. |
| 7,229,894 B2 | 6/2007 | Koh |
| 7,518,144 B2 | 4/2009 | Hirata et al. |
| 8,445,356 B1 * | 5/2013 | Cai ................... H01L 21/76283 438/427 |
| 8,525,292 B2 | 9/2013 | Cheng et al. |
| 9,269,609 B2 * | 2/2016 | Shue .................... H01L 21/7682 |
| 9,922,865 B2 | 3/2018 | Lee et al. |
| 10,177,222 B2 | 1/2019 | Won et al. |
| 10,224,396 B1 | 3/2019 | Shank et al. |
| 10,546,937 B2 * | 1/2020 | Singh ............. H01L 21/823821 |
| 2004/0147093 A1 | 7/2004 | Marty et al. |
| 2017/0092718 A1 | 3/2017 | Murata et al. |

* cited by examiner

STRUCTURES AND METHODS FOR NOISE ISOLATION IN SEMICONDUCTOR DEVICES

This application is a continuation of U.S. Non-provisional patent application Ser. No. 16/035,128, titled "Structures and Methods for Noise Isolation in Semiconductor Devices," filed on Jul. 13, 2018, which claims the benefit of U.S. Provisional Patent Application No. 62/589,516 titled "Structures and Methods for Noise Isolation in Semiconductor Devices," which was filed on Nov. 21, 2017, both of which incorporated herein by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The expression "epitaxial layer" refers to a layer or structure of single crystal material. Likewise, the expression "epitaxially grown" refers to a layer or structure of single crystal material. Epitaxially-grown material can be doped or undoped.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

To avoid undesirable noise transmitting in integrated circuits, semiconductor devices can be isolated from each other by isolation structures, such as field oxides, shallow trench isolation (STI) regions, dielectric-filled gap structures, any other suitable isolation structures, or any combination thereof. For devices that operate at radio frequency (RF), reducing RF noise coupling through the substrate or buried oxide is important because poor RF isolation can limit RF devices and applications in front-end modules (FEMs). As technologies progress, integrated circuits have decreasing dimension requirements over previous generation devices. However, there are challenges in implementing such features and processes. For example, decreased critical dimensions of the photolithography process can lead to gap structures with higher aspect ratios (e.g., depth to width ratio of the gap structure), and the noise isolation capability of isolation structures such as STI regions can degrade as devices are placed closer to each other.

Various embodiments in accordance with this disclosure provide semiconductor structures and methods for forming semiconductor structures with reduced device crosstalk and improved noise isolation. Embodiments of the semiconductor structures in this disclosure incorporate one or more negatively-sloped deep isolation trenches and air pockets formed within the trenches and between adjacent devices. The negatively-sloped deep isolation trenches (e.g., tapered toward the trench top) and air pockets provide, among other things, benefits of (i) increased amount of isolation material deposited between adjacent devices, especially at the bottom of the trench and thus provide enhanced noise isolation performance, and (ii) air pockets with increased size can be formed in the negatively-sloped deep trenches and filled with material that has dielectric constant as low as 1 (e.g., air), in which the air pocket structure further reduces the average dielectric constant of material between adjacent devices and in turn reduces crosstalk. In some embodiments, deep trenches can be trenches formed through one or more layers of the semiconductor structures. In some embodiments, deep trenches can have an aspect ratio between about 3 to about 10.

A negatively-sloped deep trench can be between devices formed on substrates, such as silicon substrates, sapphire substrates, silicon-on-insulator (SOI) substrates, or any other suitable substrate. SOI substrates includes a silicon substrate, a buried oxide (BOX) layer, and a device layer formed on the BOX layer. The negatively-sloped deep trench can be formed in the SOI substrates and between adjacent devices. In some embodiments, dry etching followed by wet etching of the SOI structure can be used to form a negative slope profile. As a result of the etching process, the width of an opening at the top of the trench is less than the width of the opening at the bottom of the trench. After the negatively-sloped trench is formed, a deposition process can be used to deposit isolation material inside the trench and on exposed surfaces between adjacent devices. Due to the negatively-sloped profile of the deep trench, ion density is greater at the top opening than at the bottom opening of the trench. As a result, in some embodiments, a deposition rate at the top of the trench is greater than the deposition rate at the bottom or sidewall surfaces of the trench.

The deposition process continues until the top of the trench is fully deposited with an isolation material, while a layer of isolation material is formed within the trench. Therefore, after the deposition process, gaps can be formed in the trench where no isolation material is deposited. In some embodiments, the gaps can include a pocket of air with a dielectric constant of 1, which is usually less than the dielectric constant of the isolation material. In some embodiments, the gap can be filled with any suitable type of gas. In some embodiments, other low-k materials can be used to form the gap material. Even if the isolation material is a low-k dielectric material, forming the gap within the deep trench can also save material and in turn reduce device cost. In some embodiments, a liner layer can be formed within the deep trench. For example, a liner layer can be formed between the isolation material and the SOI structure. In some embodiments, the volume of the gap can be about 80% of the volume of the deep trench.

Figure 1:
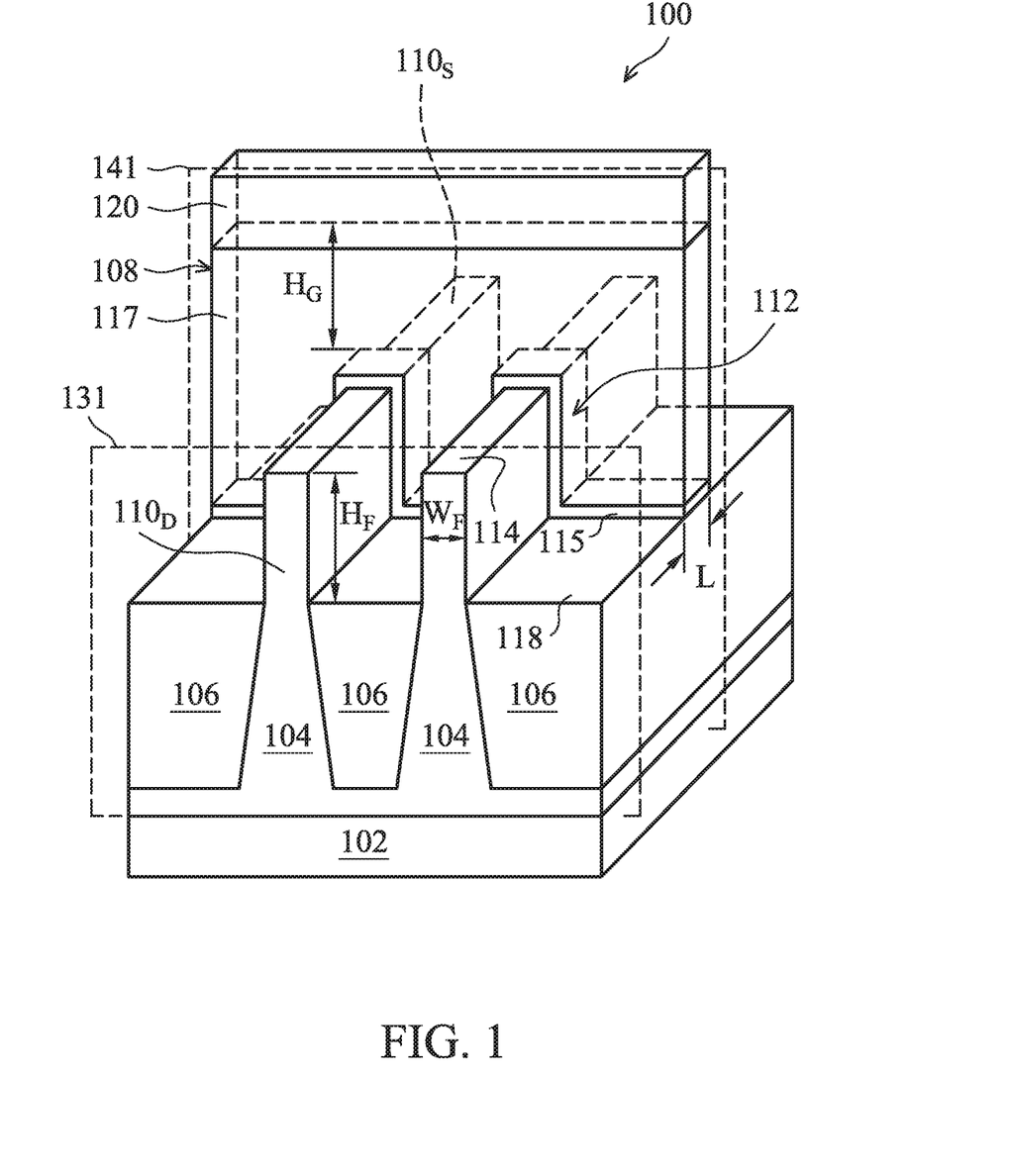
FIG. 1 is an isometric view of FinFET devices with isolation structures, in accordance with some embodiments.

Before describing the embodiments related to the formation process of enhanced gap fill layer in FinFETs structures, an example fabrication process for a FinFET is presented. FIG. 1 provides an isometric view of a semiconductor device that includes partially-fabricated FinFETs, in accordance with some embodiments.

FIG. 1 is an isometric view of a semiconductor structure 100, in accordance with some embodiments of the present disclosure. Semiconductor structure 100 includes FinFETs. Semiconductor structure 100 includes a substrate 102, a plurality of fins 104, a plurality of isolation structures 106, and a gate structure 108. Gate structure 108 is disposed over sidewalls and a top surface of each of fins 104. Fins 104 and isolation structures 106 have top surfaces 114 and 118, respectively. Gate structure 108 includes a gate dielectric structure 115 and a gate electrode 117. In some embodiments, one or more additional layers or structures can be included in gate structure 108 (but are not shown for simplicity and clarity purposes).

FIG. 1 shows a hard mask 120 disposed on a top surface of gate electrode 117. Hard mask 120 can be used to pattern, such as by etching, gate structure 108. In some embodiments, hard mask 120 includes a dielectric material, such as silicon nitride. The isometric view of FIG. 1 is taken after a patterning process (e.g., etching) of a gate dielectric layer and a gate electrode layer is performed to form a gate structure 108.

Each of the plurality of fins 104 shown in FIG. 1 includes a pair of source/drain (S/D) terminals, where a source terminal is referred to as source region $110_S$ and a drain terminal is referred to as drain region $110_D$. The source and drain regions $110_S$ and $110_D$ are interchangeable and are formed in, on, and/or surrounding fins 104. A channel region 112 of fins 104 underlies gate structure 108. Gate structure 108 has a gate length L and a gate width ($[2×H_F]+W_F$), as shown in FIG. 1. In some embodiments, the gate length L is in a range from about 10 nm to about 30 nm. In some embodiments, the gate length L is in a range from about 3 nm to about 10 nm. In some embodiments, the fin width $W_F$ is in a range from about 6 nm to about 12 nm. In some embodiments, the fin width W is in a range from about 4 nm to about 6 nm. Gate height $H_G$ of gate structure 108, measured from a fin top surface 114 to the top of gate structure 108, is in a range from about 50 nm to about 80 nm, according to some embodiments. Fin height $H_F$ of fin 104, measured from the isolation structure top surface 118 to fin top surface 114, is in a range from about 5 nm to about 100 nm, according to some embodiments.

Substrate 102 can be a silicon substrate, according to some embodiments. In some embodiments, substrate 102 can be (i) another semiconductor, such as germanium (Ge); (ii) a compound semiconductor including silicon carbide, gallium arsenide, gallium phosphide, indium phosphide, indium arsenide, GaAsP, AlInAs, AlGaAs, GaInAs, GaInP, GaInAsP, indium antimonide, any other suitable material, or any combination thereof (iii) an alloy semiconductor including SiGe; or (iv) combinations thereof. In some embodiments, substrate 102 can be an SOI material. In some embodiments, substrate 102 can be an epitaxial material.

Fins 104 are active regions where one or more transistors are formed. Fins 104 can include: (i) silicon (Si) or another elementary semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP indium antimonide, any other suitable material, or any combination thereof; (iii) an alloy semiconductor including SiGe; or (iv) combinations thereof. Fins 104 can be fabricated using suitable processes including photolithography and etch processes. The photolithography process can include forming a photoresist layer overlying the substrate (e.g., on a silicon layer), exposing the resist to a pattern, performing post-exposure bake processes, and developing the resist to form a masking element including the resist. The masking element can then be used to protect regions of the substrate while an etch process forms recesses into substrate 102, leaving protruding fins. The recesses can be etched using a reactive ion etch (RIE) or any other suitable process. Numerous other methods to form fins 104 on substrate 102 may be suitable. For example, fins 104 can include epitaxial material, in accordance with some embodiments.

Isolation structures 106 can be used to provide electrical separation between adjacent devices. For example, isolation structures 106 are positioned between adjacent fins 104 of the FinFET devices. Isolation structures 106 can partially fill the recesses between adjacent fins and can include a dielectric material, such as silicon oxide, spin-on-glass, $SiN_x$, silicon oxynitride, FSG, a low-k dielectric material, any other suitable insulating material, or combinations thereof.

In some embodiments, isolation structures 106 can be shallow trench isolation (STI) structures and are formed by etching trenches in substrate 102. The trenches can be filled with insulating material, followed by CMP and etch-back processes. Other fabrication techniques for isolation structures 106 and/or fins 104 are possible. Isolation structures 106 can include a multi-layer structure, such as a structure with one or more liner layers. Isolation structures 106 can also be formed by depositing an enhanced gap fill layer using a multi-step deposition and treatment process to eliminate voids and seams in the gap fill material.

Gate structure 108 can include a gate dielectric layer 115, a gate electrode 117, a spacer layer, and/or one or more additional layers, according to some embodiments. In some embodiments, gate structure 108 uses polysilicon as gate electrode 117. Also shown in FIG. 1 is a hard mask 120 disposed on a top surface of gate electrode structure 117. Hard mask 120 is used to pattern, such as by etching, gate structure 108. In some embodiments, hard mask 120 includes a dielectric material, such as silicon nitride.

Although gate structure 108 is described as using polysilicon or amorphous silicon for gate electrode 117, gate structure 108 can be a sacrificial gate structure formed in a replacement gate process for a metal gate structure. Metal gate structure can include one or more n-type or p-type work function metal layers for adjusting threshold voltages of semiconductor devices such as, for example, planar devices or FinFET devices. Exemplary p-type work function metals that can be included in the metal gate structure are TiN, tantalum nitride (TaN), ruthenium (Ru), molybdenum (Mo), aluminum (Al), tungsten nitride (WN), zirconium disilicide ($ZrSi_2$), molybdenum disilicide ($MoSi_2$), tantalum disilicide ($TaSi_2$), nickel disilicide ($NiSi_2$), platinum (Pt), any other suitable p-type work function material, or combinations thereof. Exemplary n-type work function metals that can be included in the metal gate structure are Al, titanium (Ti), silver (Ag), tantalum aluminum (TaAl), tantalum aluminum carbon (TaAlC), tantalum aluminum nitride (TiAlN), tantalum carbide (TaC), tantalum carbide nitride (TaCN), tantalum silicide nitride (TaSiN), manganese (Mn), zirconium (Zr), any other suitable n-type work function material, or combinations thereof. A work function is associated with the material composition of the work function layer. Thus, the material of a work function layer is chosen to tune its work function so that a desired threshold voltage $V_{th}$ can be achieved by a device formed in the respective region. The work function layer(s) can be deposited by CVD, PECVD, ALD, any other suitable process, or combinations thereof.

A fill metal layer can be deposited over the work function metal layer(s). The fill metal layer fills in remaining portions of trenches or openings formed by removal of the sacrificial gate structure. The fill metal layer can include Al, W, copper (Cu), any other suitable material, or any combination thereof. The fill metal can be formed by ALD, CVD, PVD, plating, any other suitable process, or any combination thereof.

Semiconductor device structure 100 may require additional processing to form other features, such as lightly-doped-drain (LDD) regions and doped S/D structures. The term "LDD region" is used to describe lightly-doped regions disposed between a channel region of a transistor and at least one of the transistor's S/D regions. LDD regions can be formed in fins 104 by doping. Ion implantation can be used, for example, for the doping process. Further, other processes can be used for doping the LDD regions. For simplicity, other processing operations to form other features of semiconductor device structure 100 are not described herein.

Figure 2:
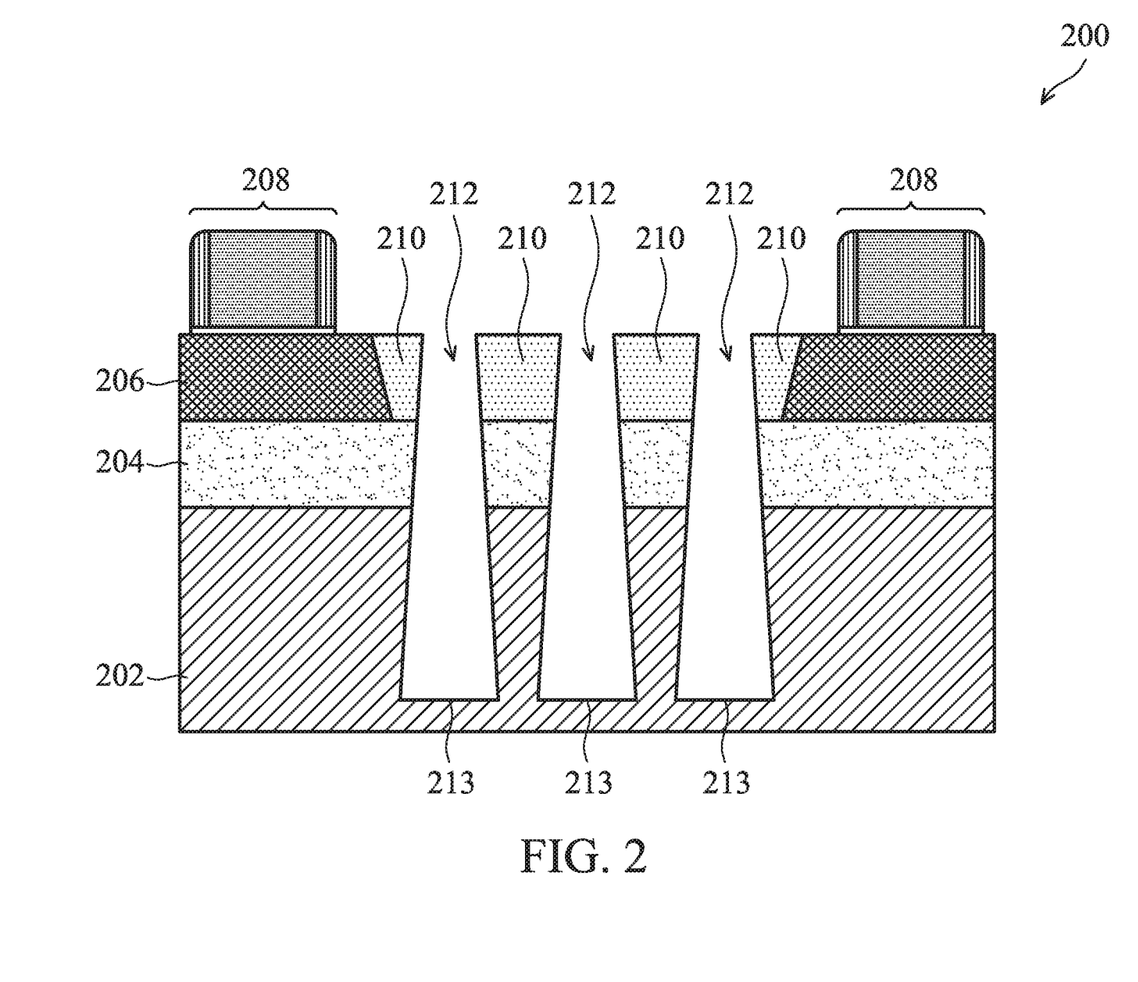
FIG. 2 is a cross-sectional view of a semiconductor structure after forming deep isolation trenches, in accordance with some embodiments.

FIG. 2 is a cross-sectional view of a semiconductor structure 200, in accordance with some embodiments of the present disclosure. Semiconductor structure 200 includes a substrate 202, a dielectric layer 204, a device layer 206, semiconductor devices 208, and STI regions 210. Semiconductor devices 208 are formed on device layer 206. STI regions 210 can be formed between semiconductor devices 208 and on dielectric layer 204. One or more deep isolation trenches 212 are formed in semiconductor structure 200. Other structures can be included in semiconductor structure 200 but are not illustrated for simplicity and clarity purposes.

Similar to substrate 102 described above, substrate 202 can be a silicon substrate, according to some embodiments. In some embodiments, substrate 202 can be (i) another semiconductor, such as germanium (Ge); (ii) a compound semiconductor including silicon carbide, gallium arsenide, gallium phosphide, indium phosphide, indium arsenide, GaAsP, AlInAs, AlGaAs, GaInAs, GaInP, GaInAsP, indium antimonide, any other suitable material, or any combination thereof; (iii) an alloy semiconductor including SiGe; or (iv) combinations thereof. In some embodiments, substrate 202 can be a silicon substrate for an SOI material. In some embodiments, substrate 202 can be an epitaxial material.

Dielectric layer 204 can include a dielectric material, such as silicon oxide, spin-on-glass, silicon nitride, silicon oxynitride, FSG, a low-k dielectric material, any other suitable insulating material, or combinations thereof. Dielectric layer 204 can also be a buried oxide (BOX) layer of an SOI material. The BOX layer can be formed by a process such as separation by implanted oxygen (SIMOX), wafer bonding, any other suitable process, or any combination thereof.

Device layer 206 can be formed on dielectric layer 204 and can be used to form a variety of semiconductor devices. Device layer 206 can be crystalline silicon or polysilicon. In some embodiments, the device layer 206 can include other elementary semiconductors (e.g., as germanium) or a compound semiconductor (e.g., silicon carbide, gallium arsenide, indium arsenide, or indium phosphide).

Semiconductor devices 208 can be formed on device layer 206. Semiconductor device layer 208 can include one or more integrated circuit devices (not shown), such as CMOS devices, (e.g., NMOS and/or PMOS transistors). Semiconductor devices 208 can also include circuitry associated with transistors such as interconnect layers (e.g., metal lines and vias) and interlayer dielectric layers (ILD). In some embodiments, semiconductor devices 208 can be RF circuitry and devices. In some embodiments, semiconductor devices 208 can be FinFET devices.

STI regions 210 can be formed on dielectric layer 204 and can be used to provide electrical isolation between semiconductor devices 208. STI regions 210 can be formed using insulating materials, such as silicon oxide, silicon nitride, silicon oxynitride, fluoride-doped silicate glass (FSG), a low-k dielectric material, any other suitable composition, or any combination thereof. STI regions 210 can be formed using any suitable deposition process, such as CVD, physical vapor deposition (PVD), atomic layer deposition (ALD), molecular beam epitaxy (MBE), high density plasma CVD (HDPCVD), metal organic (MOCVD), remote plasma CVD (RPCVD), plasma-enhanced CVD (PECVD), plating, any other suitable process, or combinations thereof. In some embodiments, STI regions 210 are formed prior to the formation of semiconductor devices 208 and can be planarized using a planarization process (e.g., chemical mechanical polishing) such that top surfaces of STI region 210 and device layer 206 are coplanar.

One or more deep isolation trenches 212 can be formed between semiconductor devices 208 to provide an opening for subsequent formation of isolation structures. As shown in FIG. 2, each deep isolation trenches 212 can be tapered towards the top of the trench structure, which includes a narrower opening at the top as compared to the bottom. For example, deep isolation trenches 212 include a top opening that is coplanar with the top surface of STI regions 210 and a bottom surface 213. Deep isolation trenches 212 can be formed such that the width at the top opening is less than the width at bottom surface 213. In some embodiments, deep isolation trenches 212 can include a flat bottom surface 213. In some embodiments, bottom surface 213 is curved. In some embodiments, the sidewalls of deep isolation trenches 212 can be flat or include convex surfaces.

Multiple processes can be used to form deep isolation trenches 212, including photolithography and etch processes. The photolithography process can include forming a photoresist layer overlying STI material used to form the STI region 210, exposing the photoresist layer to a pattern, performing post-exposure bake processes, and developing the photoresist to form a masking element that includes the photoresist. The etching process can be selected based on the material composition of substrate 202, dielectric layer 204, and STI regions 210 such that the deep isolation trenches can be tapered towards the top.

The etching processes can be performed layer by layer using the patterned masking element as an etch mask. For example, a first etching process can be used to remove exposed portions of STI material to form STI regions 210. A second etching process can be used to remove exposed portions of underlying dielectric layer 204. A third etching process can be used to remove exposed portions of substrate 202 and the etching process can continue until the a nominal depth into substrate 202 is achieved. Multiple etching processes can be used to form deep isolation trenches 212. For example, the etching process can be one or more of, dry etching, wet etching, reactive ion etching, any other suitable etching method, or any combination thereof. The etch processes to form deep isolation trenches 212 can be plasma processes, such as a reactive ion etching (RIE) process using oxygen-based plasma. In some embodiments, the RIE etching process can include other etchant gas, such as nitrogen, carbon tetrafluoride ($CF_4$), any other suitable gas, or any combination thereof. In some embodiments, deep RIE (DRIE) processes can be used. In some embodiments, any suitable plasma etching processes can be used. In some embodiments, the etching processes can be a combination of a dry etching process followed by a wet etching process. Additional suitable operations can be used to form deep isolation trenches 212.

Figure 3:
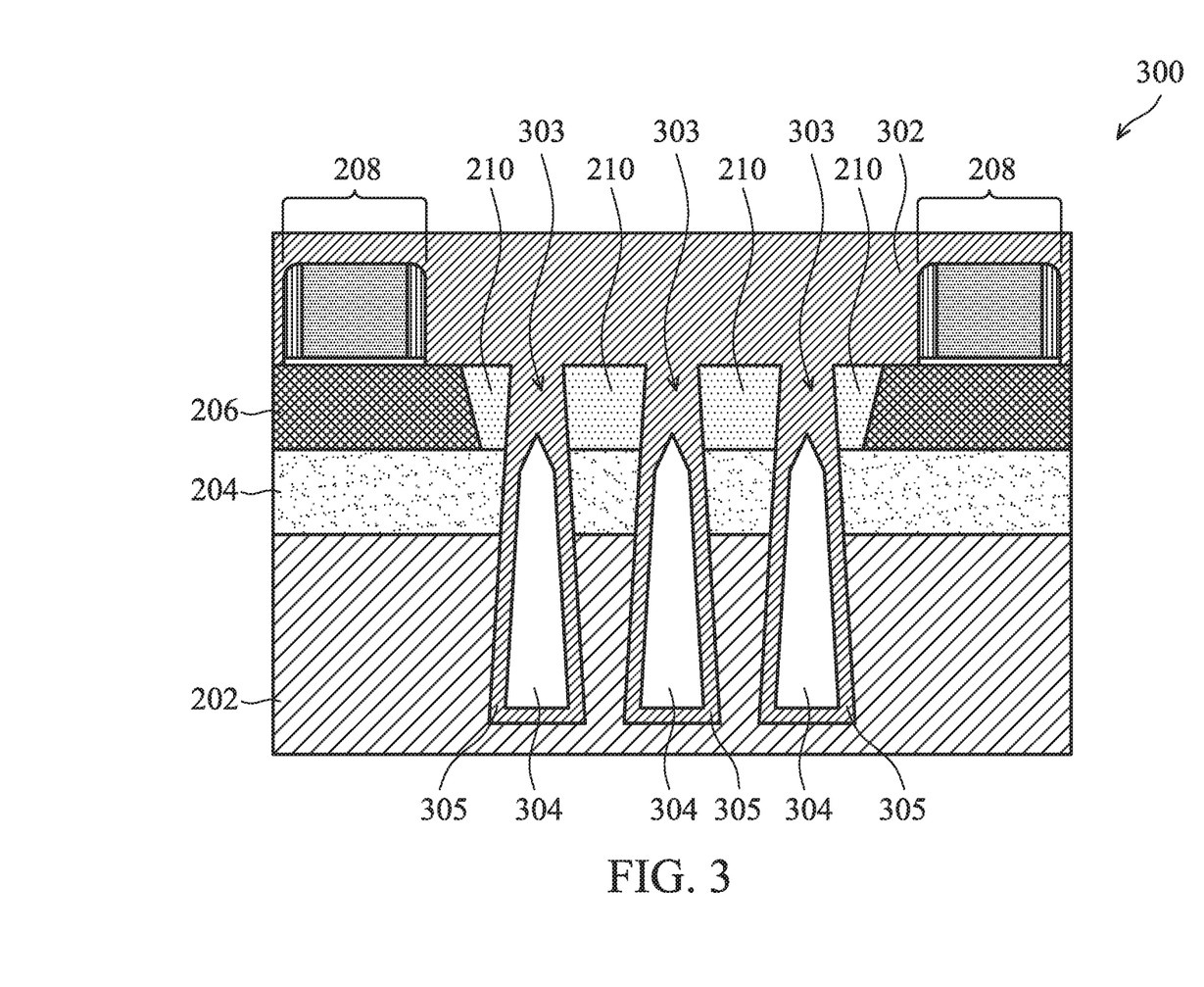
FIG. 3 is a cross-sectional view of a semiconductor structure after depositing a dielectric layer and forming air pockets in deep isolation trenches, in accordance with some embodiments.

FIG. 3 is a cross-sectional view of a semiconductor structure 300, in accordance with some embodiments of the present disclosure. Semiconductor structure 300 includes a substrate 202, dielectric layer 204, device layer 206, semiconductor devices 208, STI regions 210, an ILD layer 302, deep isolation structures 303, and air pockets 304. Other structures can be included in semiconductor structure 300 and are not illustrated for simplicity and clarity purposes.

ILD layer 302 can be deposited onto the semiconductor structure 200 described above in FIG. 2. ILD layer 302 can partially fill the deep isolation trenches 212 to form deep isolation structures 303. Deep isolation structures 303 can include air pockets 304 and dielectric portions 305. As shown in FIG. 3, dielectric portions 305 can be formed along the inner surface of the previously-formed deep isolation trenches 212 (of FIG. 2) as a liner layer and joining at the top of the trenches to encapsulate air pockets 304.

ILD layer 302 can include any suitable material, such as silicon oxide, silicon nitride, silicon oxynitride, silicon carbide, fluoride-doped silicate glass (FSG), a low k dielectric material, or any combination thereof. In some embodiments, ILD layer 302 can be formed by two or more layers; for example, ILD layer 302 can include a silicon oxide layer and a silicon nitride layer. In some embodiments, the thicknesses of the silicon oxide and silicon nitride layers can be different. In some embodiments, their thicknesses can be substantially the same. The deposition of ILD layer 302 can be done by any suitable process, such as CVD, PVD, ALD, MBE, HDPCVD, MOCVD, RPCVD, PECVD, plating, or combinations thereof.

Due to the negatively-sloped profile of deep trenches, ion density for the deposition processes is greater at the top opening than the bottom of the deep isolation trenches 212 of FIG. 2. As a result, the deposition rate at the top of the trenches is greater than the deposition rate at the bottom or sidewall surfaces of the trenches. The deposition process continues until the top of deep isolation trench 212 is closed or sealed (e.g., fully or completely deposited) with the isolation material while a layer of isolation material is formed within the trench. Therefore, after the deposition process, gaps can be formed in the trenches where no isolation material is deposited. In some embodiments, the gaps can include a pocket of air with a dielectric constant of 1, which can be less than the dielectric constant of ILD layer 302. In some embodiments, the gaps can include pockets of other materials with low dielectric constant; for example, the gaps can include other types of gas, such as an inert gas, or suitable material, such as a porous material. In some embodiments, ILD layer 302 is also deposited on and between semiconductor devices 208, as shown in FIG. 3.

Deep isolation structures 303 formed between adjacent semiconductor devices can reduce device crosstalk and improve noise isolation. In some embodiments, deep isolation structures 303 can be formed between and separating adjacent devices as shown in FIG. 3. In some embodiments, deep isolation structures 303 can surround a device or a group or devices all around. Deep isolation structures 303 can reduce device crosstalk and improve noise isolation by reducing the average dielectric constant of the structure. For example, deep isolation structures 303 can include air pockets 304 which has a dielectric constant of 1. Compared to isolation structures including only materials with higher dielectric constants (e.g., silicon oxide or silicon nitride), deep isolation structures 303 with enclosed air pockets can provide a lower average dielectric constant and in turn provide lower capacitance between devices and improve noise isolation. In addition, deep isolation structures 303 require less substrate material than isolation structures with a wider top opening; therefore, deep isolation structures 303 can deposit more noise isolation material in the trenches to improve noise isolation. In some embodiments, air pockets 304 can be formed in substrate 202, dielectric layer 204, and STI region 210. In some embodiments, a greater volume ratio of air pocket 304 within deep isolation structure 303 can further reduce the average dielectric constant and provide greater noise isolation and/or further reduction in crosstalk. A maximum value of volume ratio of air pocket 304 (i.e., volume ratio of air pocket over the deep isolation structure) can be determined by device needs and also physical limitations of the fabrication process. For example, the maximum volume ratio can be determined by whether the mechanical strength of dielectric portions 305 formed along the inner surface of the deep isolation trenches can mechanically support air pocket 304 without collapsing. In some embodiments, a ratio between the volume of the air pocket 304 and total volume of deep isolation structure 303 can be in a range of about 30% to about 80% (e.g., 30% to 80%). In some embodiments, a single air pocket 304 is formed in deep isolation structures 303. In some embodiments, more than one air pocket can be formed in deep isolation structure 303.

Figure 4:
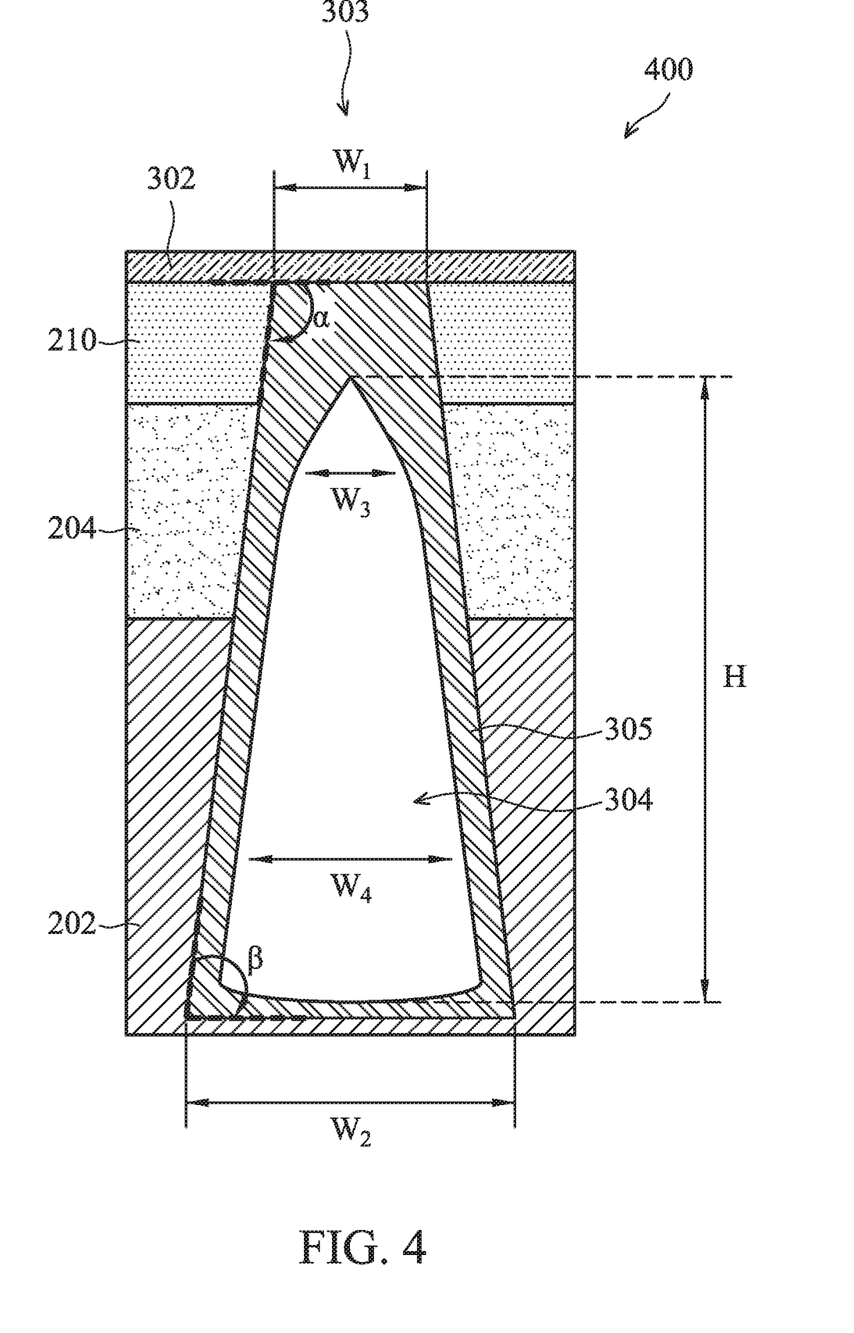
FIG. 4 is a cross-sectional view of a deep isolation structure, in accordance with some embodiments.

FIG. 4 is a cross-sectional view of a semiconductor structure 400, in accordance with some embodiments of the present disclosure. Semiconductor structure 400 is a detailed view of deep isolated structure 303 as described above in FIG. 3. Semiconductor structure 400 includes substrate 202, dielectric layer 204, STI regions 210, ILD layer 302, deep isolation structure 303, and air pocket 304. Other structures can be included in semiconductor structure 400 and are not illustrated for simplicity and clarity purposes.

As shown in FIG. 4, deep isolation structures 303 has a width $W_1$ at the top and width $W_2$ at the bottom surface. In some embodiments, width $W_1$ can be in a range of about 250 Å to about 700 Å (e.g., 250 Å to 700 Å). In some embodiments, width $W_1$ can be no more than 1200 Å. In some embodiments, width $W_2$ can be in a range of about 265 Å to about 1200 Å (e.g., 265 Å to 1200 Å). The ratio between widths $W_1$ and $W_2$ can be in a range of 60% to 95%. Width of the air pocket 304 can be measured at different heights within the deep isolation trench. For example, a width $W_3$ of air pocket 304 can be measured at 70% of the trench depth and a width $W_4$ of air pocket 304 can be measured at 20% of the trench depth, and that the ratio between $W_3$ to $W_4$ can be in a range of 5% to 30%. In some embodiments, $W_4$ is greater than $W_3$. In some embodiments, a ratio between $W_4$ and $W_2$ can be between 50% to 80%. In some embodiments, a ratio between the volume of the air pocket and total volume of deep isolation structure 303 can be in a range of 30% to 80%. In some embodiments, height H of deep isolation structures 303 can be in a range of about 300 nm to about 700 nm. In some embodiments, the aspect ratio of deep isolation structures 303 can be greater than or equal to 4.

In some embodiments, the bottom shape of the deep isolation trench is a flat surface. In some embodiments, the bottom shape of the deep isolation structure can be a curved surface. An angle α defined as the angle between sidewalls of the deep isolation structure and the top surface of STI region 210 can be greater than 90°. In some embodiments, angle α can be between 90° and 120°. An angle β defined as the angle between sidewalls and bottom surface of the deep isolation structure can be less than 90°. In some embodiments, angle β can be between 65° and 90°. In some embodiments, the bottom surface of air pocket 304 follows the contours (e.g., curvature) of the bottom surface of deep isolation structure 303. The sidewalls of air pockets 304 can be a flat surface, in accordance with some embodiments. The air pocket sidewalls can also have a convex shape, where the angle between the air pocket sidewall and air pocket bottom surface can be within ±10% of the angle β.

Figure 5:
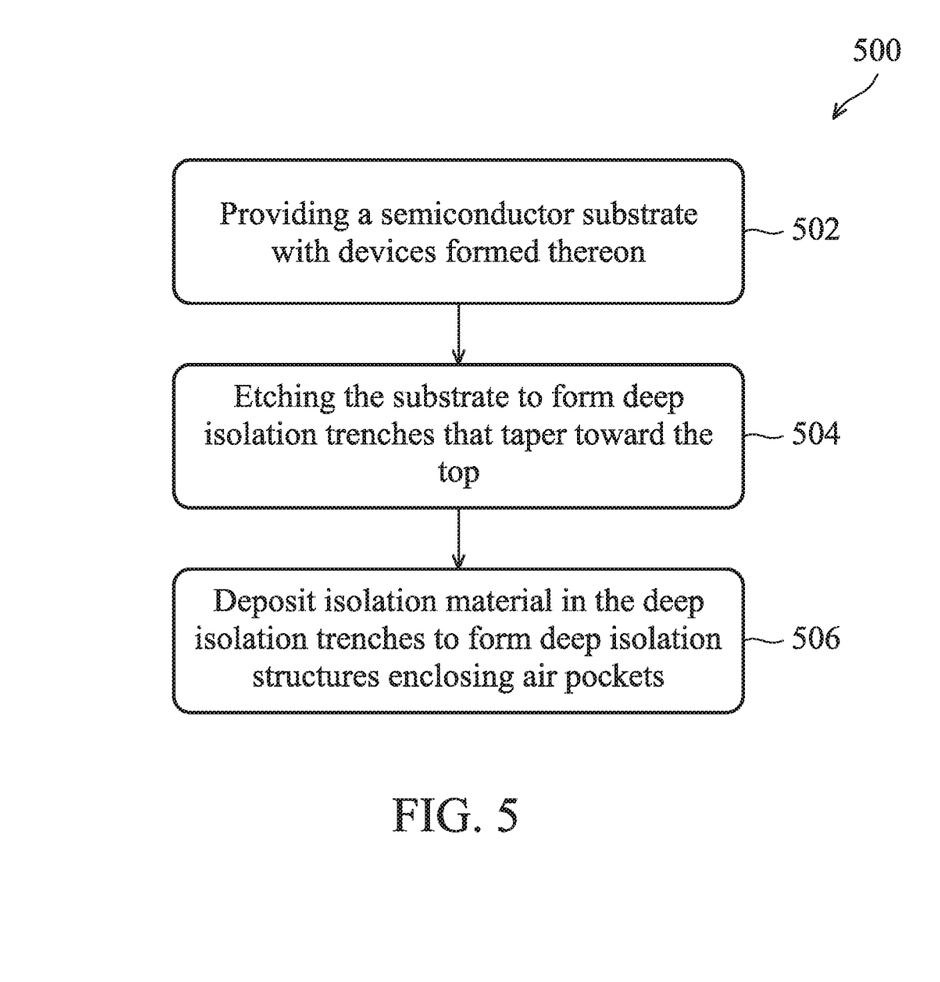
FIG. 5 is a flow diagram of an exemplary method of forming deep isolation structures, in accordance with some embodiments.

FIG. 5 is a flow diagram of an exemplary method 500 of forming deep isolation structures with enclosed air pockets, in accordance with some embodiments of the present disclosure. Based on the disclosure herein, operations in method 500 can be performed in a different order and/or vary.

At operation 502, a semiconductor substrate with devices formed thereon is provided, in accordance with some embodiments. Semiconductor structures and devices are formed on and/or within a semiconductor structure. The semiconductor structure can include a substrate, one or more etch stop layers, and one or more dielectric layers. The semiconductor structure can also include other layers as needed. The substrate can be a silicon substrate, according to some embodiments. In some embodiments, the substrate can be (i) another semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, indium antimonide, any other suitable material, or any combination thereof (iii) an alloy semiconductor including SiGe; or (iv) combinations thereof. In some embodiments, the substrate can be an SOI. In some embodiments, the substrate can be an epitaxial material. In some embodiments, the substrate can include any suitable layers/structures, such as etch stop layers, dielectric layer, via, interconnects, or any combination thereof. The dielectric layer includes a dielectric material, such as silicon oxide, spin-on-glass, SiN, silicon oxynitride, FSG, a low-k dielectric material, any other suitable insulating material, or any combination thereof. Dielectric layer deposition can be done by any suitable process. In some embodiments, the substrate can also include a processed integrated circuit wafer that includes, for example, a plurality of transistors configured to be CMOS circuits, RF circuitry and devices, etc. In some embodiments, active and passive devices—such as transistors, diodes, capacitors, resistors, inductors, and the like—can be formed on and/or within the semiconductor substrate. In some embodiments, the semiconductor substrate includes raised features, such as fins. Fins can be fabricated using suitable processes including photolithography and etch processes. An example of the substrate can be substrate 102 as described with respect to FIG. 1.

At operation 504, the substrate is etched to form deep isolation trenches that taper toward the top, in accordance with some embodiments. One or more deep isolation trenches can be formed between semiconductor devices to provide an opening for subsequent formation of isolation structures. Each deep isolation trench can be tapered towards the top of the trench structure, which includes a narrower opening at the top compared to the width at the trench bottom. In some embodiments, the deep isolation trenches can include a flat bottom surface. In some embodiments, the bottom surface can be a curved surface. In some embodiments, the sidewalls of the deep isolation trenches, such as the deep isolation trenches 212 in FIG. 2, can be flat or convex surfaces. Multiple processes can be used to form the deep isolation trenches, including processes such as photolithography and etch processes. The etch processes to form deep isolation trenches can be plasma processes, such as an RIE process using oxygen-based plasma. In some embodiments, the RIE etching process can include other etchant gases, such as nitrogen, carbon tetrafluoride ($CF_4$), any other suitable gas, or any combination thereof. Numerous other methods to form deep isolation trenches can also be suitable. Examples of deep isolation trenches can be deep isolation trenches 212 in FIG. 2.

At operation 506, isolation material is deposited in the deep isolation trenches to form deep isolation structures enclosing air pockets, in accordance with some embodiments. An ILD layer can be deposited onto the structure described above in FIG. 2. ILD layer can partially fill the deep isolation trenches to form deep isolation structures. Deep isolation structures can include air pockets and dielectric portions. The dielectric portions can be formed along the inner surface of the previously-formed deep isolation trenches as a liner layer, which joins at the top of the trenches to encapsulate air pockets. The ILD layer can include any suitable material, such as silicon oxide, silicon nitride, silicon oxynitride, silicon carbide, fluoride-doped silicate glass (FSG), a low k dielectric material, or combinations thereof. In some embodiments, the ILD layer can be formed by two or more layers. Due to the negatively-sloped profile of the deep trenches, ion density for the deposition processes is greater at the top opening than at the bottom of the deep isolation trenches. As a result, the deposition rate at the top of the trenches is greater than the deposition rate at the bottom or sidewall surfaces of the trenches. Therefore, after the deposition process, gaps can be formed in the trenches where no isolation material is deposited. In some embodiments, the gaps can include a pocket of air with a dielectric constant of 1, which can be less than the dielectric constant of the ILD layer. In some embodiments, the gaps can include pockets of other materials with low dielectric constant, for example, the gaps can include other types of gas or suitable material. In some embodiments, ILD layer is also deposited on and between the semiconductor devices. Examples of ILD layer and air pockets can be ILD layer 302 and air pocket 304, respectively, as shown in FIG. 3.

Various embodiments in accordance with this disclosure provide semiconductor structures and methods for forming semiconductor structures with reduced device crosstalk and improved noise isolation. Negatively-sloped deep trenches and air pockets can be formed within trenches and between adjacent devices. The negatively-sloped deep trenches and air pockets provide benefits such as an increased amount of isolation material deposited between adjacent devices, especially at the bottom of the trench and thus provide enhanced noise isolation performance. Each negatively-sloped deep trench can include a single air pocket that extends through multiple layers of the semiconductor structure. In addition, a volume of the single air pocket can be between about 30% and about 80% of a total volume of the negatively-sloped deep trench. Because air pockets can be formed in the negatively-sloped deep trenches and filled with material such as air (which has dielectric constant as low as 1), the air pocket structure further reduces the average dielectric constant of material between adjacent devices and in turn reduces device crosstalk.

In some embodiments, a semiconductor structure includes a substrate with a top surface and first and second devices formed on the top surface of the substrate. The semiconductor structure also includes a deep isolation structure formed in the substrate and between the first and second devices. The deep isolation structure includes a top portion formed at the top surface and having a top width and a bottom surface having a bottom width larger than the top width.

In some embodiments, a semiconductor structure includes a substrate and a first dielectric layer formed on the substrate. The semiconductor structure also includes a second layer formed on the first dielectric layer. The semiconductor structure further includes a first and second semiconductor devices formed on the device layer. A plurality of isolation structures are formed in the substrate and the first and second dielectric layers. Each isolation structure includes a top width measured at a top surface of the second dielectric layer. The semiconductor structure also includes a bottom width measured at a bottom surface of the isolation structure. The top width is less than the bottom width.

In some embodiments, a method for forming a semiconductor device includes providing a substrate and forming first and second devices on the substrate. The method also includes etching a deep trench in the substrate and between the first and second devices. A top opening of the deep trench is narrower than a bottom surface of the deep trench. The method also includes depositing a dielectric material between the first and second devices and in the plurality of deep trenches.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A semiconductor structure, comprising:
a substrate with a top surface;
a device layer over the top surface of the substrate;
first and second devices formed on first and second portions of the device layer, respectively;
a shallow trench isolation (STI) region in contact with first and second sidewalls of the first and second portions of the device layer, respectively; and
an isolation structure between the first and second devices and extending through the STI region, wherein the isolation structure comprises:
a top portion formed at the top surface and having a top width;
a bottom surface having a bottom width larger than the top width; and
an air pocket extending through the isolation structure, wherein the air pocket comprises a first width at the top surface of the substrate and a second width at the bottom surface of the isolation structure, wherein the second width is larger than the first width.

2. The semiconductor structure of claim 1, wherein the isolation structure further comprises a first portion comprising a first material with a first dielectric constant and a second portion comprising a second material with a second dielectric constant lower than the first dielectric constant.

3. The semiconductor structure of claim 1, wherein the substrate comprises a silicon-on-insulator (SOI) substrate.

4. The semiconductor structure of claim 1, wherein the isolation structure comprises a sidewall, wherein a first angle between the sidewall and the top surface of the substrate is greater than about 90°.

5. The semiconductor structure of claim 4, wherein a second angle between the sidewall of the isolation structure and the bottom surface is less than about 90°.

6. The semiconductor structure of claim 1, wherein a ratio of the top width to the bottom width is between about 0.6 and about 0.95.

7. The semiconductor structure of claim 1, wherein the isolation structure further comprises a dielectric material structure.

8. The semiconductor structure of claim 1, wherein a ratio of the first width to the second width is between about 5% and about 30%.

9. The semiconductor structure of claim 1, wherein a volume of the air pocket is between about 30% and about 80% of a total volume of the isolation structure.

10. The semiconductor structure of claim 8, wherein the air pocket comprises another bottom surface which contours the bottom surface of the isolation structure.

11. A semiconductor structure, comprising:
a substrate;
a first dielectric layer formed on the substrate;
a second dielectric layer formed on the first dielectric layer, wherein the second dielectric layer comprises top and bottom surfaces;
a device layer on the second dielectric layer, the device layer comprising first and second portions;
first and second semiconductor devices formed on the first and second portions of the device layer, respectively;
a shallow trench isolation (STI) region in contact with first and second sidewalls of the first and second portions of the device layer, respectively; and
an isolation structure formed in the substrate and extending through the STI region, wherein the isolation structure comprises:
a top width measured at the top surface of the second dielectric layer;
a bottom width measured at a bottom surface of the isolation structure, wherein the top width is less than the bottom width; and
an air pocket extending through the bottom surface of the second dielectric layer.

12. The semiconductor structure of claim 11, wherein the isolation structure further comprises a first portion comprising a first material with a first dielectric constant and a second portion comprising a second material with a second dielectric constant.

13. The semiconductor structure of claim 12, wherein the first dielectric constant is a low-k dielectric constant.

14. The semiconductor structure of claim 13, wherein the second dielectric constant is about 1.

15. The semiconductor structure of claim 12, wherein the air pocket has a first width at the top surface of the second dielectric layer and a second width at the bottom surface of the isolation structure, wherein the second width is larger than the first width.

16. A method for forming a semiconductor device, comprising:
providing a substrate;
depositing a device layer on the substrate, the device layer comprising first and second portions;
forming first and second devices on the first and second portions of the device layer, respectively;
forming a shallow trench isolation (STI) region in contact with first and second sidewalls of the first and second portions of the device layer, respectively;
etching, in the substrate, at least one trench that extends through the STI region, wherein a top opening of the at least one trench is narrower than a bottom surface of the trench; and
depositing a dielectric material between the first and second devices and in the at least one trench, wherein:
the deposited dielectric material forms an air pocket in the at least one trench; and
the air pocket comprises a top portion with a top width and a bottom portion with a bottom width, wherein the bottom width is larger than the top width.

17. The method of claim 16, wherein the etching comprises etching one or more dielectric layers of the substrate.

18. The method of claim 16, wherein a ratio of the top width to the bottom width is between about 5% and 30%.

19. The method of claim 16, wherein the depositing comprises depositing the dielectric material using a physical vapor deposition method.

20. The method of claim 16, wherein the etching comprises etching the at least one trench using a wet chemical etching method.

* * * * *